United States Patent
Maue et al.

[19]

[11] Patent Number: 5,805,402
[45] Date of Patent: Sep. 8, 1998

[54] INTEGRATED INTERIOR TRIM AND ELECTRICAL ASSEMBLY FOR AN AUTOMOTIVE VEHICLE

[75] Inventors: H. Winston Maue, Farmington Hills; George A. Wooldridge, Warren, both of Mich.

[73] Assignee: UT Automotive Dearborn, Inc., Dearborn, Mich.

[21] Appl. No.: 569,684

[22] Filed: Dec. 8, 1995

Related U.S. Application Data

[63] Continuation-in-part of Ser. No. 264,796, Jun. 23, 1994, which is a continuation-in-part of Ser. No. 73,899, Jun. 9, 1993.

[51] Int. Cl.$^6$ ............................................. H02H 3/00
[52] U.S. Cl. ........................ 361/93; 361/115; 361/826; 307/10.1
[58] Field of Search .............................. 361/93, 115, 826, 361/749, 752; 307/10.1

[56] References Cited

U.S. PATENT DOCUMENTS

| | | | |
|---|---|---|---|
| 3,555,497 | 1/1971 | Watanabe | 439/857 |
| 3,701,071 | 10/1972 | Landman | 339/4 |
| 3,713,080 | 1/1973 | Kennedy | 339/258 R |
| 3,854,973 | 12/1974 | Mersereau et al. | 117/47 A |
| 3,961,228 | 6/1976 | Briggs et al. | 317/101 R |
| 3,982,081 | 9/1976 | Demler, Jr. | 200/5 R |
| 4,052,094 | 10/1977 | Widen | 292/336.3 |
| 4,085,502 | 4/1978 | Ostman et al. | 29/629 |

(List continued on next page.)

FOREIGN PATENT DOCUMENTS

| | | | |
|---|---|---|---|
| 0 209 072 | 1/1987 | European Pat. Off. | B30R 16/02 |
| 0 240 453 | 10/1987 | European Pat. Off. | B60R 16/02 |

(List continued on next page.)

OTHER PUBLICATIONS

Seminar Paper entitled "Silicon Rubber and Tactile Switch and Rubber Technology Seminar", Prepared by S/G Industries, Inc., Jan. 26, 1995.

"Quick Reference Guide to Standard Sculptured Flexible Products", by Advanced Circuit Technology, Inc., 1993.

Brochure entitles "General Silicones", by General Silicones Co., Ltd., prior to Dec. 8, 1995.

Flyer entitled QMA . . . Quality, Merit & Accomplishment for Tomorrow's Technology, by QMA, Inc., prior to Dec. 8, 1995.

(List continued on next page.)

*Primary Examiner*—Brian K. Young
*Assistant Examiner*—Stephen Jackson
*Attorney, Agent, or Firm*—Harness, Dickey & Pierce, P.L.C.

[57] ABSTRACT

An integrated interior trim and electrical assembly for use in an automotive vehicle includes an integrated electrical junction box and an interior trim panel. The interior trim panel has a generally rigid substrate covered by an aesthetically pleasing covering material. The junction box includes a flexible printed circuit board, a rigid printed circuit board, a busbar and insulator assembly, and a conductive deposited trace. The integrated interior trim and electrical assembly employs a sheet-like electrically conductive circuit layer which distributes electricity between a switch and an electricity activated device. A sheet-like electrically conductive layer is partially external from and partially disposed inside of an electrical junction box wherein it is electrically connected to one or more of the other circuit layers also contained within the junction box. Portions of the sheet-like electrically conductive layer external to the junction box are also suitable for integration with a series of occupant operable switches. Another aspect of the present invention employs a conductive elastomeric pad between internal circuit layers. A portion of an electrical junction box is molded within an interior trim panel substrate. Integrated interior trim and electrical assembly, a sheet-like electrically conductive layer is formed and affixed within an interior trim panel.

31 Claims, 7 Drawing Sheets

U.S. PATENT DOCUMENTS

| | | | |
|---|---|---|---|
| 4,135,226 | 1/1979 | Kourimsky | 361/415 |
| 4,208,080 | 6/1980 | Teagno | 339/18 |
| 4,226,464 | 10/1980 | Janz et al. | 296/153 |
| 4,255,004 | 3/1981 | Kourimsky et al. | 339/17 |
| 4,355,853 | 10/1982 | Kourimsky | 339/17 |
| 4,357,750 | 11/1982 | Ostman | 29/847 |
| 4,534,025 | 8/1985 | Floyd | 370/85 |
| 4,577,917 | 3/1986 | Nashimoto et al. | 339/150 |
| 4,602,834 | 7/1986 | Hahn et al. | 339/19 |
| 4,603,894 | 8/1986 | Osenkowski | 292/216 |
| 4,603,928 | 8/1986 | Evans | 339/17 |
| 4,669,793 | 6/1987 | Hayashi et al. | 439/64 |
| 4,678,249 | 7/1987 | Black, III et al. | 439/77 |
| 4,689,718 | 8/1987 | Maue et al. | 361/360 |
| 4,703,397 | 10/1987 | Minoura et al. | 361/428 |
| 4,707,394 | 11/1987 | Chant | 428/209 |
| 4,785,585 | 11/1988 | Grier et al. | 49/502 |
| 4,797,508 | 1/1989 | Chant | 174/68.5 |
| 4,798,545 | 1/1989 | Roy et al. | 439/677 |
| 4,850,636 | 7/1989 | McLaren et al. | 296/146 |
| 4,850,884 | 7/1989 | Sawai et al. | 439/76 |
| 4,853,277 | 8/1989 | Chant | 428/209 |
| 4,906,195 | 3/1990 | Kubota et al. | 439/76 |
| 4,923,411 | 5/1990 | Hayashi et al. | 439/540 |
| 4,937,977 | 7/1990 | Gergoe et al. | 49/352 |
| 4,943,109 | 7/1990 | Skrbina et al. | 296/146 |
| 4,954,085 | 9/1990 | Inoue et al. | 439/34 |
| 4,997,390 | 3/1991 | Scholtz et al. | 439/509 |
| 5,023,752 | 6/1991 | Detter et al. | 361/399 |
| 5,040,097 | 8/1991 | Stibel | 361/395 |
| 5,040,168 | 8/1991 | Maue et al. | 359/115 |
| 5,057,026 | 10/1991 | Sawai et al. | 439/76 |
| 5,084,124 | 1/1992 | Taniguchi | 156/315 |
| 5,091,031 | 2/1992 | Strappazzini | 156/211 |
| 5,095,659 | 3/1992 | Benoit et al. | 49/502 |
| 5,107,404 | 4/1992 | Tam | 361/424 |
| 5,154,647 | 10/1992 | Ishitani et al. | 439/933 |
| 5,160,274 | 11/1992 | Ozaki et al. | 439/212 |
| 5,173,228 | 12/1992 | Kargarzadeh et al. | 264/46.7 |
| 5,174,066 | 12/1992 | Dupuy | 49/502 |
| 5,207,591 | 5/1993 | Ozaki et al. | 439/212 |
| 5,208,734 | 5/1993 | Sumeno | 361/388 |
| 5,226,259 | 7/1993 | Yamagata et al. | 49/502 |
| 5,227,955 | 7/1993 | Le Bris et al. | 361/395 |
| 5,251,403 | 10/1993 | Compeau et al. | 49/502 |
| 5,255,155 | 10/1993 | Sugimoto et al. | 361/749 |
| 5,285,010 | 2/1994 | Huber | 174/52.1 |
| 5,308,225 | 5/1994 | Hlavaty | 292/216 |
| 5,308,138 | 5/1994 | Hlavaty | 296/146.6 |
| 5,309,634 | 5/1994 | Van Order et al. | 29/863 |
| 5,324,203 | 6/1994 | Sano et al. | 439/34 |
| 5,340,425 | 8/1994 | Strappazini | 156/211 |
| 5,351,443 | 10/1994 | Kimura et al. | 49/502 |
| 5,353,190 | 10/1994 | Nakayama et al. | 361/647 |
| 5,355,629 | 10/1994 | Kimura et al. | 49/502 |
| 5,357,065 | 10/1994 | Mitamura et al. | 200/5 A |
| 5,367,832 | 11/1994 | Compeau et al. | 49/502 |
| 5,387,023 | 2/1995 | Deneau | 296/72 |
| 5,403,980 | 4/1995 | Eckrich | 200/52 R |
| 5,411,688 | 5/1995 | Morrison et al. | 264/45.4 |
| 5,425,206 | 6/1995 | Compeau et al. | 49/502 |
| 5,442,518 | 8/1995 | Beam | 361/690 |
| 5,478,244 | 12/1995 | Maue et al. | 439/76.2 |
| 5,484,186 | 1/1996 | Van Order et al. | 296/97.5 |

FOREIGN PATENT DOCUMENTS

| | | | |
|---|---|---|---|
| 0 248 181 A1 | 12/1987 | European Pat. Off. | B60R 16/02 |
| 0 387 772 A1 | 9/1990 | European Pat. Off. | H01R 31/02 |
| 0 567 403 A1 | 10/1993 | European Pat. Off. | H05K 5/00 |
| 0 572 052 A1 | 12/1993 | European Pat. Off. | B60R 16/02 |
| 2 502 887 | 10/1982 | France | H01H 35/20 |
| 924968 | 3/1955 | Germany | 439/34 |
| 2409660 | 9/1975 | Germany | H02B 1/10 |
| 3048451 | 7/1982 | Germany | H01R 23/72 |
| 3732087 C1 | 12/1988 | Germany | H02G 3/18 |
| 3824857 A1 | 2/1989 | Germany | B60R 16/02 |
| 3906667 | 9/1989 | Germany | B60R 16/02 |
| 4028504 | 3/1991 | Germany | H01L 23/58 |
| 3936906 | 5/1991 | Germany | H05K 5/00 |
| 1418031 | 12/1975 | United Kingdom | 439/34 |
| WO 94/29145 | 12/1994 | WIPO | B60R 16/02 |

OTHER PUBLICATIONS

Connection Ideas, vol. 3, No. 1, "Choosing Sculptured® Felixible Interconnecting Systems . . . the Key is Termination", by Advanced Circuit Technology, Inc., 1987.

Connection Ideas, vol. 3, No. 4, "Modular–Flex™ Comes of Age", by Advanced Circuit Technology, Inc., 1988.

Brochure entitled "PolySwitch SMD", by Raychem, prior to Dec. 8, 1995.

Brochure entitled "We Thrive on Challenge Pass your Problems to ACT . . . ", by Advanced Circuit Technology, prior to Dec. 8, 1995.

Booklet entitled "Silitek Rubber Division", by Silitek Corporation, 1995–96 Edition.

"PolySwitch PTC Devices", Specification Sheets, by Raychem Corporation, Jun. 9–29, 1992, 14 Sheets.

Brochure entitled "Memtron® Technologies, Inc., In Touch with your Technology.®", by Memtron Technologies, Inc., prior to Dec. 8, 1995.

Brochure entitled "Membrane Switches Product Information", by Memtron Technologies Inc., prior to Dec. 8, 1995.

Brochure entitled "Instrumentation Graphic Overlays Product Information", by Memtron Technologies, Inc., prior to Dec. 8, 1995.

Brochure entitled "Conductive and Non–Conductive Silicone Rubber Keyboards Product Information", by Memtron Technologies, Inc., prior to Dec. 8, 1995.

Brochure entitled "Business Partnership Information", Memtron Technologies, Inc., prior to Dec. 8, 1995.

Brochure entitled "Switches with LEDS Product Information", by Memtron Technologies, Inc., prior to Dec. 8, 1995.

Brochure entitled "Product Markings Product Information", by Memtron Technologies, Inc., prior to Dec. 8, 1995.

"Interconnect Evolution", by Advanced Circuit Technology, prior to Dec. 8, 1995, 2 pages.

"Medical", by Advanced Circuit Technology, prior to Dec. 8, 1995, 1 page.

"Impedance Interconnects", by Advanced Circuit Technology, prior to Dec. 8, 1995, 1 page.

"Commercial", by Advanced Circuit Technology, prior to Dec. 8, 1995, 1 page.

"Industrial", by Advanced Circuit Technology, prior to Dec. 8, 1995, 1 page.

"Military", by Advanced Circuit Technology, prior to Dec. 8, 1995, 1 page.

"Custom and Standard Sculptured® Jumpers Your Competitive Edge", by Advanced Circuits Technology, prior to Dec. 8, 1995, 2 pages.

"ACT Brief History", by Advanced Circuit Technology, prior to Dec. 8, 1995, 1 page.

"PolySwitch Products" by Raychem, prior to Dec. 8, 1995, 4 pages.

Brochure entitled "PolySwitch Strap PCT Overcurrent Protection", by Raychem prior to Dec. 8, 1995, 4 pages.

Brochure entitled "PolySwitch RLine RUE Product Family", by Raychem prior to Dec. 8, 1995, 4 pages.

International Search Report (EPO), Sep. 26, 1995, 3 pages.

English Translation of German Patent No. 924,968 Mar. 10, 1955.

English Translation of EPO Publication No. 0 248 181 A1 Dec. 9, 1987.

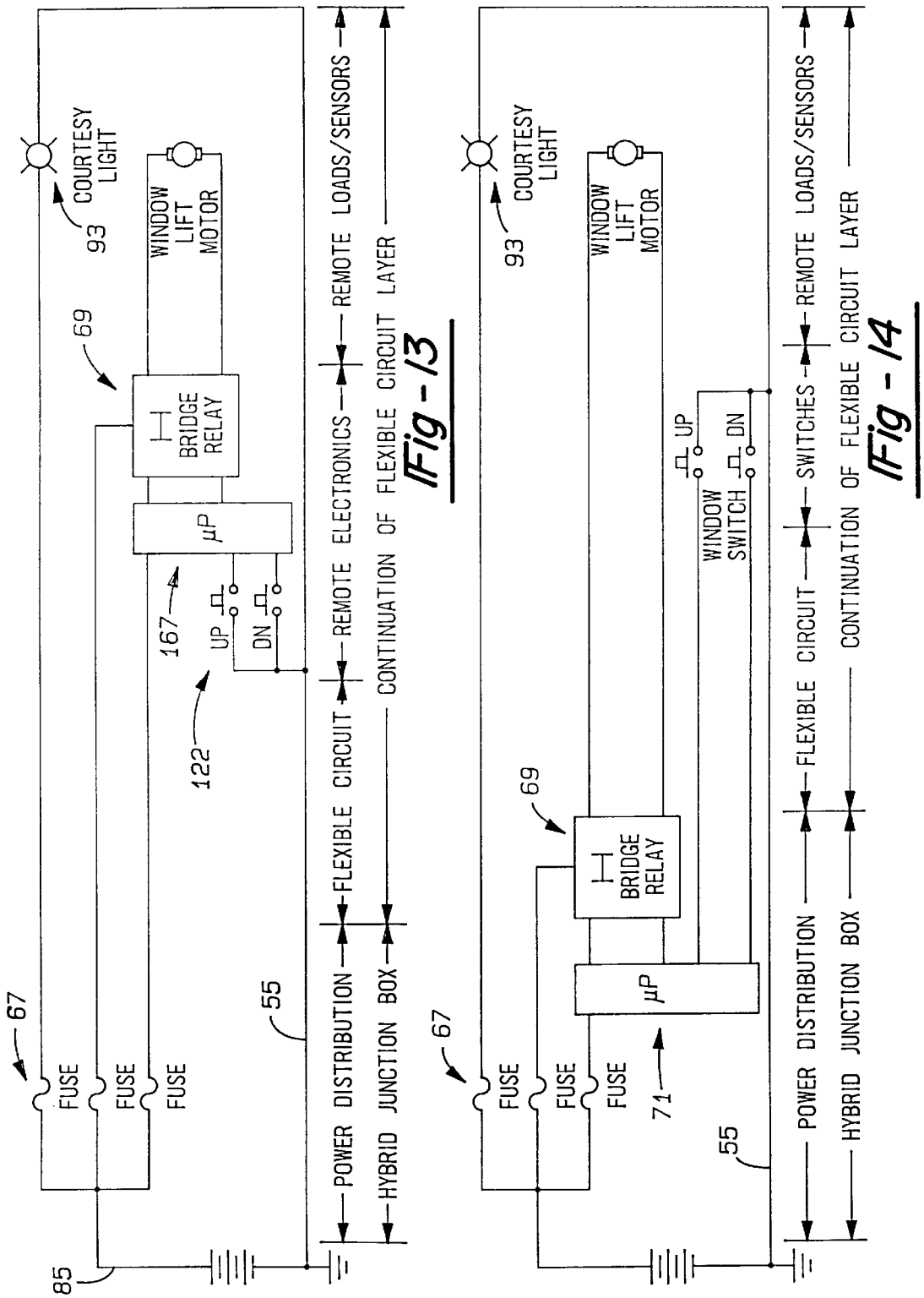

INTEGRATED INTERIOR TRIM AND ELECTRICAL ASSEMBLY FOR AN AUTOMOTIVE VEHICLE

CROSS-REFERENCE TO RELATED APPLICATIONS

This application is a continuation-in-part of co-pending U.S. patent application Ser. No. 08/264,796, filed on Jun. 23, 1994, which is a continuation-in-part of U.S. patent application Ser. No. 08/073,899, filed on Jun. 9, 1993, the continuation of which will issue as U.S. Pat. No. 5,478,244 on Dec. 26, 1995, all of which are incorporated by reference herewithin.

BACKGROUND OF THE INVENTION

This invention relates generally to electrical systems within automotive vehicles and specifically to an automotive vehicle integrated interior trim and electrical assembly.

Before the introduction of junction box technology, wire harnesses for automotive vehicles had to be individually tailored for particular vehicle options. Wire harnesses were extremely complex, required labor intensive and costly splicing.

With the introduction of junction boxes for connecting various wire harnesses together, the wire harness complexity and costs were reduced while the quality and reliability of the vehicle electrical system were enhanced. Two conventional constructions of internal electric current carrying circuits are commonly used in junction boxes disposed in engine compartments or attached to the bulkhead or brace under instrument panels within passenger compartments. The first circuit construction uses alternating layers of conductive busbars and insulators. The busbars have male blades which protrude upward through slots in each insulating layer. Furthermore, external wire harnesses are connected directly to many of these busbar male blades. This first construction is generally shown in the following U.S. Pat. No. 5,207,591 entitled "Branch Junction Box and Busbars for Branch Connection" which issued to Ozaki et al. on May 4, 1993; U.S. Pat. No. 5,160,274 entitled "Branch Junction Box and Busbars for Branch Connection" which issued to Ozaki et al. on Nov. 3, 1992; U.S. Pat. No. 5,154,647 entitled "Electrical Junction Block for Automobile and a Method for Manufacturing the Same" which issued to Ishitani et al. on Oct. 13, 1992; and U.S. Pat. No. 4,850,884 entitled "Controller-Including Wiring Apparatus for Automotive Vehicle" which issued to Sawai et al. on Jul. 25, 1989. The second traditional junction box construction consists of a plurality of rigid printed circuit boards having male and female terminals projecting perpendicular therefrom. External wire harnesses and electronic modules are often connected to these various terminals. Such a construction is disclosed in the following U.S. Pat. No. : 4,689,718 entitled "Programmable Junction Box" which issued to Maue et al. on Aug. 25, 1987; U.S. Pat. No. 4,703,397 entitled "Function Circuit Incorporating Type Wiring Device for Automobile" which issued to Minoura et al. on Oct. 27, 1987; and U.S. Pat. No. 4,135,226 entitled "Automatic Junction Unit" which issued to Kourimsky on Jan. 16, 1979. Moreover, the busbar and insulator construction and the rigid printed circuit board construction are shown combined within the inside of a junction box in U.S. Pat. No. 4,355,853 entitled "Electrical Junction Box" which issued to Kourimsky on Oct. 26, 1982.

The preceding junction box designs have improved the reliability of electrical connections within the vehicle electrical system, however, these junction boxes have become increasingly complex to assemble, heavy and large due to the many added bulky busbar and rigid printed circuit board layers. Therefore, it is desirable to have an improved junction box that is relatively small, lightweight and of low cost while further having easy to assemble internal circuitry.

Independent from a junction box, it is also known to employ a flexible printed circuit within an electrical switch. For example, reference should be made to U.S. Pat. No. 4,678,249 entitled "Electrical Switch having Flexible Printed Circuit Connector Cable" which issued to Black, III et al. on Jul. 7, 1987. However, this reference appears to merely disclose a single stand-alone backlit switch which is attached to an instrument panel or the like through a bracket. The flexible printed circuit appears to be electrically connected to the switch at one end and to a conventional wire harness at the other end.

Recently, a trend has developed toward modularization of automotive vehicle occupant door components. The majority of this modularization has occurred between the door hardware (i.e., mechanical components such as door locks, window lift regulators and the like) and various structural cassettes for mounting to the sheet metal door reinforcement. Examples of such conventional modular vehicle doors are disclosed within the following U.S. Pat. No. : 5,425,206 entitled "Tubular Plastic Mounting Panel for Door Hardware" which issued to Compeau et al. on Jun. 20, 1995; U.S. Pat. No. 5,355,629 entitled "Door Structure for Vehicle" which issued to Kimura et al. on Oct. 18, 1994; U.S. Pat. No. 5,174,066 entitled "Door Glass Cassette for Vehicles" which issued to Dupuy on Dec. 29, 1992; U.S. Pat. No. 5,095,659 entitled "Automobile Door Modular Assembly" which issued to Benoit et al. on Mar. 17, 1992; U.S. Pat. No. 4,943,109 entitled "Automotive Door Assembly having a Plug-In Electrified Interior Panel" which issued to Skrbina et al. on Jul. 24, 1990; U.S. Pat. No. 4,785,585 entitled "Vehicle Door With Separable Door Hardware Module" which issued to Grier et al. on Nov. 22, 1988; and U.S. Pat. No. 4,603,894 entitled "Lock and Handle Module for Vehicle Door" which issued to Osenkowski on Aug. 5, 1986. All of these patents are incorporated by reference herewithin.

As can be observed in the aforementioned patents, modularization of the electrical and wiring aspects of the automotive vehicle doors has been generally overlooked. Furthermore, due to the traditional design, engineering and manufacturing separation between conventional electrical and interior trim disciplines within the automotive industry, integration therebetween has not significantly evolved. Notwithstanding, it is worth noting U.S. Pat. No. 5,324,203 entitled "Electrical Harnessing Structure for Vehicle" which issued to Sano et al. on Jun. 28, 1994. This patent discloses the use of flexible printed circuits and their electrical connections behind an instrument panel and door trim panel. However, there is no discussion of a junction box. Accordingly, it would be desirable to integrate and modularize the conductive circuit layer, electrical junction box and trim functions and products to achieve the long sought after benefits of true synergistic integration.

SUMMARY OF THE INVENTION

In accordance with the present invention, the preferred embodiment of an integrated interior trim and electrical assembly for use in an automotive vehicle includes an integrated electrical junction box and an interior trim panel. The interior trim panel has a generally rigid substrate covered by an aesthetically pleasing covering material. In another aspect of the present invention, the junction box includes a flexible printed circuit board, a rigid printed circuit board, a busbar and insulator assembly, and a conductive deposited trace. In yet another aspect of the present invention, the integrated interior trim and electrical assembly employs a sheet-like electrically conductive circuit layer which distributes electricity between a switch and an electricity activated device. In still another aspect of the present invention, a sheet-like electrically conductive layer is partially external from and partially disposed inside of an electrical junction box wherein it is electrically connected to one or more of the other circuit layers also contained within the junction box. Portions of the sheet-like electrically conductive layer external to the junction box are also suitable for integration with a series of occupant operable switches. Another aspect of the present invention employs a conductive elastomeric pad between internal circuit layers. In another aspect of the present invention, a portion of an electrical junction box is molded within an interior trim panel substrate. Furthermore, in another aspect of the present invention integrated interior trim and electrical assembly, a sheet-like electrically conductive layer is formed and affixed within an interior trim panel.

The integrated interior trim and electrical assembly of the present invention is highly advantageous over conventional constructions since the present invention allows one part to serve many functions in a truly synergistic manner. For example, the sheet-like flexible printed circuit board layer of the present invention acts as a power distribution layer within a junction box, serves as an external electricity carrying circuit in place of a conventional discretely wired pigtail and electrical connector, and also forms the switch contacts. Hence, bulky and costly electrical connectors, crimps and splices are reduced. Furthermore, use of the present invention junction box within an interior door trim panel serves to reduce the number and size of traditionally cumbersome wire harnesses within the tightly packaged door while also allowing for integration of a multiplex door node within the same junction box. The present invention is further advantageous by preassembling the junction box to the interior trim panel substrate, off-line, prior to the trim panel's installation on a quickly moving final assembly line. Thus, easy electrical continuity inspections can be performed prior to final assembly so as to prevent potentially destructive disassembly from the sheet metal if problems are detected. Moreover, the interior trim panel can be positioned for convenient and easily visible electrical preassembly without requiring the conventional repeated installer ingress and egress of the moving vehicle (which often has exposed sharp metal edges) for applying conventional wire harnesses onto doors or junction boxes onto bulkheads behind instruments panels. Additionally, the junction box and wiring circuits can be formed within the interior trim panel in a single step molding operation thereby further reducing fastener and housing parts. Therefore, the present invention integrated assembly reduces parts, cost, installation time, installation effort, electrical fasteners, wire counts, wire pinching, weight, wire harness thickness in critically tight areas and part tolerance stack-ups, while also improving the overall interior trim and electrical part quality and performance.

The hybrid junction box employed in the present invention integrated assembly also has many advantages over the conventional non-integrated junction box constructions. For example, by using a variety of combinations of the conductive deposited traces, flexible printed circuit board, rigid printed circuit board, and busbar and insulator assembly, the junction box of the present invention has greater internal packaging flexibility so as to minimize its exterior size thereby increasing passenger compartment space. Moreover, a junction box with conductive deposited traces and/or a flexible printed circuit board has a relatively lower weight than does a conventional junction box having only a rigid printed circuit board or a busbar and insulator assembly. Also, the junction box of the present invention is less expensive to assemble as compared to traditional designs. An additional advantage is that the present invention junction box provides a means for electrically interconnecting circuits having differing amperage range handling capabilities. Moreover, the various electrical interfaces between each combination of internal electric current carrying circuits within the present invention is reliable, low cost and easy to assemble. Additional advantages and features of the present invention will become apparent from the following description and appended claims, taken in conjunction with the accompanying drawings.

BRIEF DESCRIPTION OF THE DRAWINGS

FIG. 13 is an electrical schematic diagram of the preferred embodiment integrated interior trim and electrical assembly of the present invention; and FIG. 14 is an electrical schematic diagram of the second alternate embodiment integrated interior trim and electrical assembly of the present invention.

DETAILED DESCRIPTION OF THE PREFERRED EMBODIMENT

Figure 1:
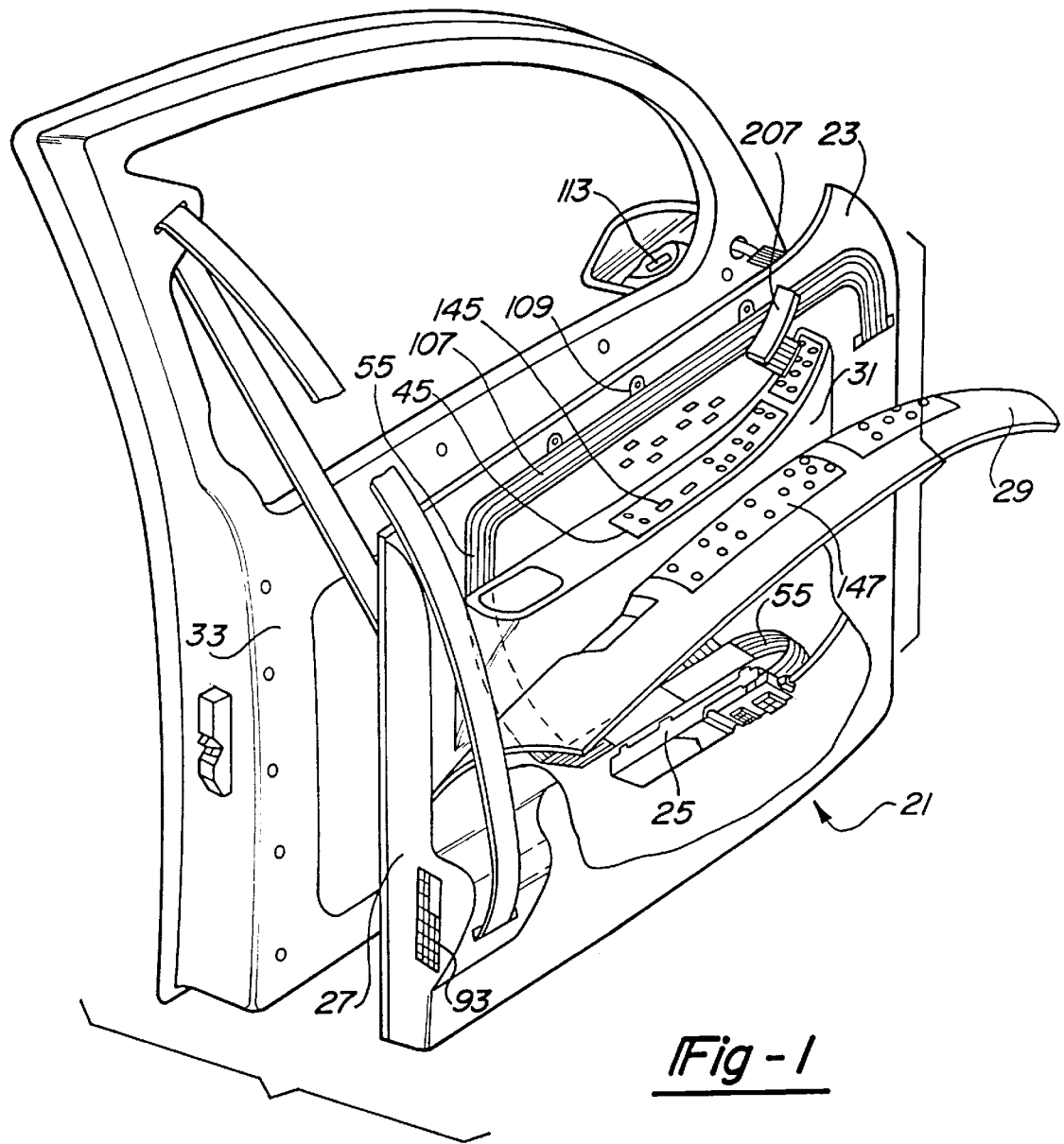
FIG. 1 is a partially exploded perspective view showing a first alternate embodiment of the integrated interior trim and electrical assembly of the present invention.

As can best be observed in FIGS. 1–4, the integrated interior trim and electrical assembly 21 of the present invention preferably includes an interior trim door panel 23 and a hybrid junction box 25. Door trim panel 23 has a generally rigid substrate 27, relatively soft foam inserts (not shown) and an aesthetically pleasing vinyl or fabric covering material 29 (shown in a partially peeled back orientation in FIG. 1). Substrate 27 can be injection molded from a polymeric material such as polypropylene or ABS, or may be reaction injection molded from a glass fiber-filled polyether amine and isocynate mixture. Furthermore, substrate 27 provides for either a separately applied armrest 31, as shown in FIG. 1, or one which can be integrally formed with the generally flat portion of door trim panel 23. The reaction injection molded door trim panel 23 can be made in accordance with the following U.S. Pat. No. 5,411,688 which issued to Morrison et al. on May 2, 1995; U.S. Pat. No. 5,340,425 which issued to Strapazzini on Aug. 23, 1994; and U.S. Pat. No. 5,091,031 which issued to Strapazzini on Feb. 25, 1992, all of which are entitled "Method for Forming Plastic Molded Panels with Inserts"; these references are all incorporated by reference herewithin. However, a more conventional variety of door trim panel 23 may also be made in accordance with U.S. Pat. No. 5,173,228 entitled "Method for Forming a 360 Degree Skin Handle" which issued to Kargarzadeh et al. on Dec. 22, 1992 or U.S. Pat. No. 4,226,464 entitled "Arm Rest Shaped to Include a Through Grip or Hand Grip with Hollow Molded Body" which issued to Janz et al. on Oct. 7, 1980, the disclosures of which are also incorporated by reference herewithin. Substrate 27 is fastened to a sheet metal door reinforcement 33 through barbed, plastic Christmas tree fasteners or the like.

Figure 3:
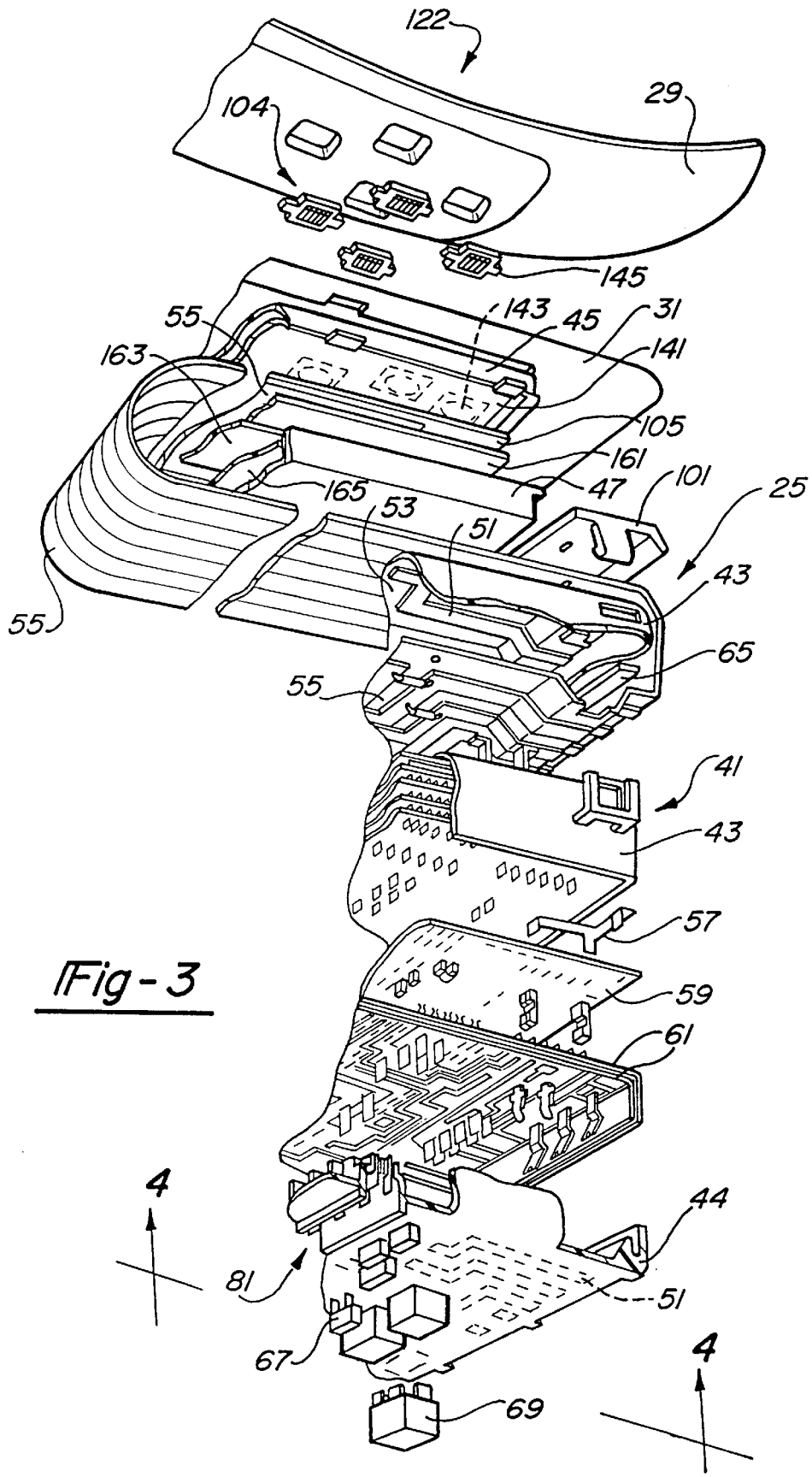
FIG. 3 is a fragmentary exploded perspective view showing the preferred embodiment of the integrated interior trim and electrical assembly of the present invention.
Figure 4:
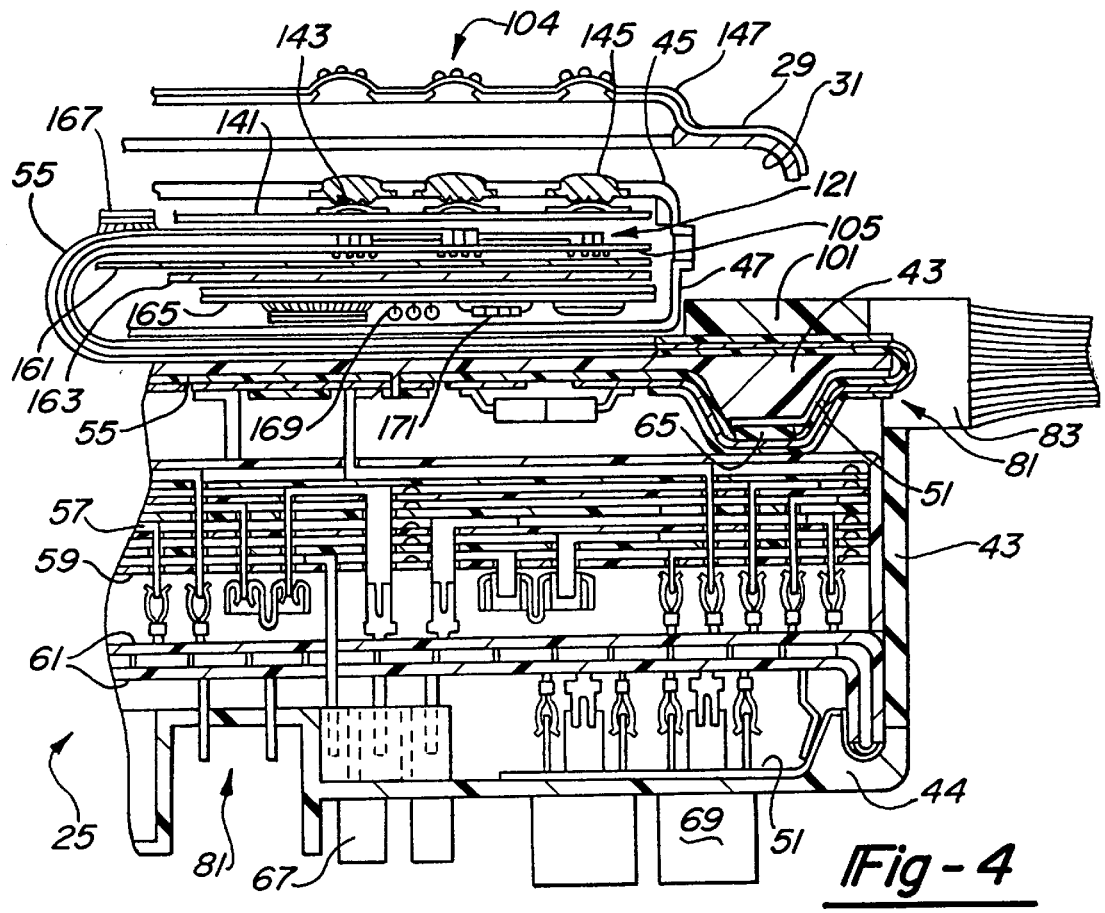
FIG. 4 is a partially exploded cross sectional view, taken along line 4—4 of FIG. 3, showing the preferred embodiment integrated interior trim and electrical assembly of the present invention.

With reference to FIGS. 3 and 4, hybrid junction box 25 preferably includes a nonconductive casing 41 injection molded from Noryl PX1 265 which can be purchased from General Electric Plastics. In this preferred embodiment, a switch base 45 and switch cover 47 are separately molded and remotely located from casing 41 defined by a power distribution box housing 43 and a separately applied cover 44 upon which the fuses and relays are mounted. A cavity is disposed within the assembled power distribution box housing 43 and cover 44 for receiving a plurality of generally parallel and somewhat flat internal circuit layers.

The electrically conductive internal circuit layers include conductive deposited metal traces 51 deposited onto walls 53 of casing 41. The junction box circuit layers further include one or more sheet-like flexible printed circuit boards 55, multiple alternating electrically conductive busbars 57 and nonconductive insulators 59, and a pair of folded back and sheet-like rigid printed circuit boards 61. Sets of stamped metallic interconnects, protruding busbars, and a conductive elastomeric pad 65 (containing silver or graphite) operably conduct electricity between these internal circuit layers.

A series of fuses 67 and relays 69 are also electrically connected and physically mounted to junction box 25. It is also envisioned that a positive temperature coefficient resistor can be used within junction box 25 instead of the externally mounted fuses 67. The positive temperature coefficient resistor is a milliohm resistance circuit protector which undergoes a large and abrupt change in resistance when an over-current or high temperature heats it above a specific point. This device automatically resets when the current or temperature fault passes. This over current and over temperature resistor is ideally suited for use behind door trim panel 23 since it does not require potentially damaging removal of door trim panel 23 from door reinforcement 33 to service blown fuses. An exemplary positive temperature coefficient resistor is known as a PolySwitch® circuit protector which can be obtained from Raychem Corporation of Menlo Park, Calif. Alternately, a FET having thermal or current sensing capability or a high side smart-power solid-state relay, such as Part No. VN02N from SGS-Thomson Micro Electronics can be used to also replace fuses 67.

Flexible printed circuit board 55 is comprised of upper and lower Mylar nonconductive polyester film sheets having a conductive layer of thin metallic foil therebetween. The metallic foil is cut or etched into individual circuits or traces for providing electric current carrying paths. The upper Mylar layer is provided with a plurality of orifices such that L-shaped terminals of the busbar and insulator assembly and conductive elastomeric pad 65 can electrically connect and compress against the congruent traces of flexible printed circuit board 55. Flexible printed circuit board 55 further contains various electronics such as diodes or even integrated circuit microprocessors 71 (see FIG. 7). Flexible circuit board 55 is an elongated sheet-like layer which can be made in accordance with U.S. Pat. Nos. 4,357,750 and 4,085,502, both of which are entitled "Jumper Cable", issued to Ostman and are incorporated by reference herewithin. Such flexible printed circuit boards can be purchased from Sheldahl Co. or Advanced Circuit Technology Inc. Alternately, a flexible sheet-like layer of conductive printed inks on a polyester carrier can be employed.

Hybrid junction box 25 is ideally suited for containing a multiplexed door node by mounting the necessary electronic control unit microprocessor and auxiliary electronics upon one or more of the low current carrying circuit layers. Thus, the hybrid junction box of the present invention is useful as a "smart power distribution box" which can be programmed through varying circuit layer and bridging interconnect architectures and through the use of the electronic control unit components. Accordingly, the hybrid junction box configuration of the present invention is especially advantageous by allowing for dense circuit layering so as to minimize door trim panel thickness and thereby maximize occupant shoulder room.

The preferred and first alternate embodiments of FIGS. 1–4 and 13 commonly show hybrid junction box 25 configured to have integrally formed electrical connectors 81 for electrically mating with separate electrical connectors 83 which, in turn, are joined to a main feeding door-to-body wire harness (not shown) and accessory wire harness pigtails such as 87. These pigtails 87 transmit electrical current to electrically activated devices such as a door lock motor or solenoid 89, a window lift motor 91 courtesy lamps 93, seat adjustment motors or the like. These are commonly high current applications thereby being distributed through high current handling and distributing circuit layers within power distribution box 25, such as the busbar and insulator assembly.

Figure 2:
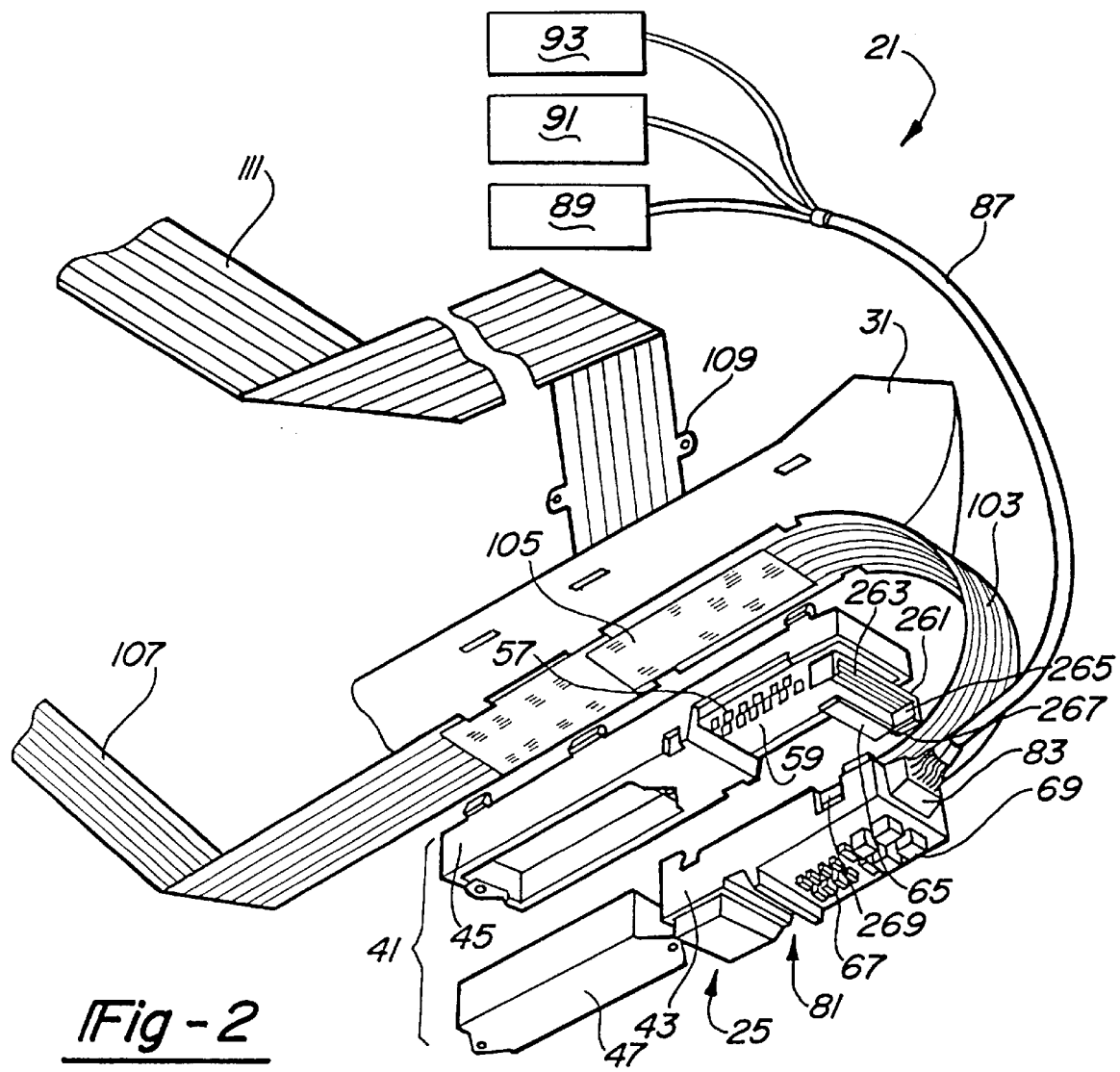
FIG. 2 is a partially exploded perspective view showing the first alternate embodiment integrated interior trim and electrical assembly of the present invention.

Flexible printed circuit board layer 55 externally exits from hybrid junction box 25 and wraps around wall 53 of housing 43. Flexible printed circuit board layer 55 is sandwiched against junction box casing 41 through either a separately injection molded relief clip 101 (as shown in FIGS. 3 and 4) or by the snap fit mounting of casing 41 against the underside of armrest 31 (as shown in FIGS. 1 and 2). In this orientation, flexible printed circuit board layer 55 is curved back on itself along curved segment 103 external to junction box 25. A bank of switches 104 operates in conjunction with a switching segment 105 of one or more flexible printed circuit board layers 55 as will be discussed in greater detail hereinafter. Additionally, a first branch 107 of flexible printed circuit board layer 55 is affixed to either side of substrate 27 by sonic or heat mushrooming of polymeric posts depending from substrate 27. These posts extend through holes within tabs 109 protruding from peripheral edges of flexible printed circuit board layer 55. Screws may also be used to secure tabs 109 to substrate 27. It is noteworthy that substrate 27 is defined herein as a member which is permanently secured to and supports covering material 29 and may include armrest 31. This first branch 107 serves to feed electrical current to other switch banks mounted to other portions of door trim panel 23. A second branch 111 of flexible printed circuit board layer 55 carries electrical current to other electricity activated devices such as an exterior mirror dimming device, compass sensor or electronic module 113. Flexible printed circuit board layer 55 is more predictably located than discrete wire harnesses, thereby having less chance of inadvertent pinching during in-molding or trim panel to body panel fastening.

Within the first alternate embodiment of FIGS. 1 and 2, casing 41 is defined by power distribution box housing 43, switch base 45 and a switch cover 47. Power distribution box housing 43 and switch cover 47 are attached to switch base 45 by way of snap fits, tongue and groove attachments, or screws (not shown). Switch base 45 snap fits onto substrate 27 of door trim panel 23 beneath armrest 31. The switch components and switching segment 105 of flexible printed circuit board layer 55 are somewhat housed and retained within switch base 45 and switch cover 47.

The first alternate embodiment of the integrated interior trim and electrical assembly 21 of FIG. 2 further has a generally U-shaped compression clip 261 which compresses a rectangular conductive elastomeric pad 65 against an adjacent circuit layer internal to hybrid junction box 25. This internal circuit layer can be a conductive deposited metal trace layer, flexible printed circuit board layer, or rigid printed circuit board layer. Compression clip 261 has multiple ridges 263 running in an elongated direction along an elongated middle section. Upstanding leg sections 265 of compression clip 261 each have an inwardly facing barbed snap fit 267 adjacent each distal end for engagement with corresponding snap fit receptacles 269 within power distribution box housing 43. Conductive elastomeric pad 65 is advantageous over traditional connectors by allowing for significant terminal or trace positioning mismatches and greater tolerance ranges without a degradation of connection quality. Lightweight and relatively low cost pad 65 is also easily assembled within the junction box and can be simply customized by recutting the pad with a standard pair of scissors, die blades or the like. Pad 65 further provides a spring-like feature when used with switches or for securing circuit layers within the junction box. Otherwise, this embodiment displays and incorporates the features of the preferred construction.

The specific integrated switch configurations will now be discussed in greater detail. The switch construction of the preferred embodiment of the integrated interior trim and electrical assembly of the present invention is shown in FIGS. 3 and 4. In this embodiment, switch circuit contacts 121 are contained within switching segment 105 of each flexible printed circuit board layer 55 and 161 corresponding with each operator accessible switch 122. Switch circuit contact 121 is integrally created with and electrically connected to conductive traces 123 running into junction box 25 without an intervening, discontinuous and dissimilar circuit layer therebetween (e.g., rigid printed circuit boards). An orifice 125 is cut within the upper polyester insulating layer for allowing direct access to switch circuit contact 121. A flat insulating spacer and carrier sheet 141 is positioned above and generally parallel to switch segment 105 of each flexible printed circuit board layer 55 and 161. This spacer 141 has a plurality of apertures cut therein over which is mounted stainless steel tactile domes or poppies 143. These domes 143 are operably compressed by depression of corresponding actuator buttons 145. Actuator buttons 145 are preferably injection molded from a Noryl polymer. A polycarbonate or polyester membrane switch overlay 147 is heat welded upon vinyl covering material 29 for providing an aesthetically pleasing and environmentally protective layer covering actuator buttons 145. Membrane switch overlay 147 is intended to carry pad printed lettering and can be obtained from Memtron Technologies Inc. of Frakenmuth, Mich. Actuator buttons 145 are further held in registry by partially protruding through openings within switch base 45. An electrically conductive elastomeric pad 163 is disposed in a flat and parallel manner below secondary flexible printed circuit board layer 161. A remote rigid printed circuit board layer 165, diodes 169 and resistors 171, are also contained within the remotely located switch module and electrically connected to flexible printed circuit board layer 161 by way of conductive elastomeric pad 163. The optional secondary flexible printed circuit board layer 161, which is offset from layer 55 at switching segment 105, may be necessary if the trace and switch contact pattern densities are too great for the primary layer 55. Layer 161 is joined into junction box 25 in a manner similar to layer 55. Furthermore, layer 55 contains a microprocessor 167 housed within the switch module. Power distribution box housing 43 is preferably screwed directly onto the back side of door trim panel substrate 27. FIG. 13 is an electrical schematic showing the simplified electrical and layer relationships of the hybrid junction box, switch module and electricity activated devices.

Figure 5:
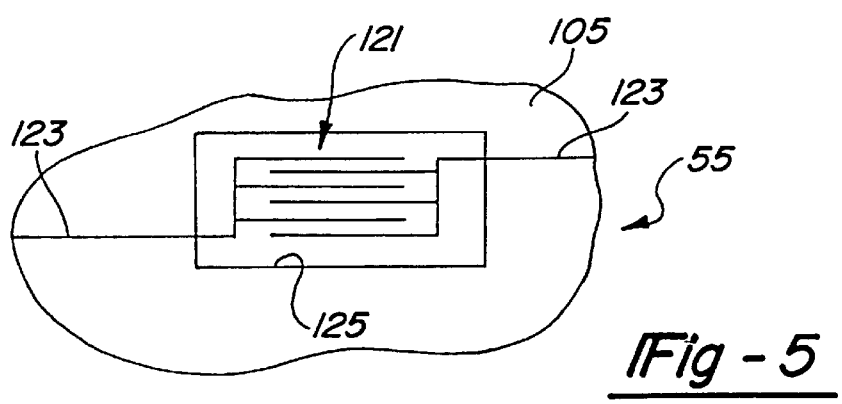
FIG. 5 is an enlarged fragmentary view showing the switch circuit contact pattern of the first alternate embodiment integrated interior trim and electrical assembly of the present invention.
Figure 6:
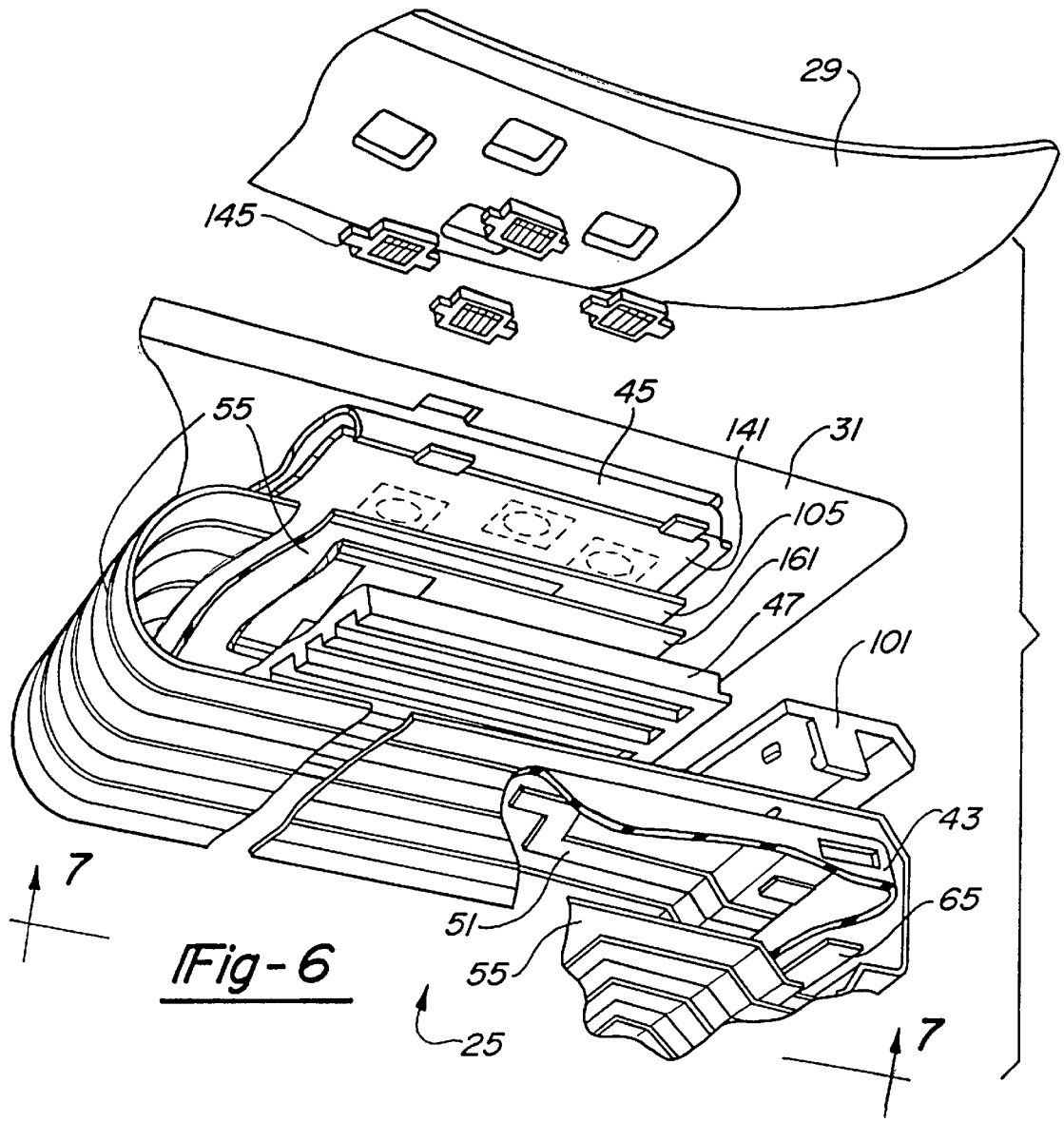
FIG. 6 is a fragmentary exploded perspective view showing a second alternate embodiment of the integrated interior trim and electrical assembly of the present invention.
Figure 7:
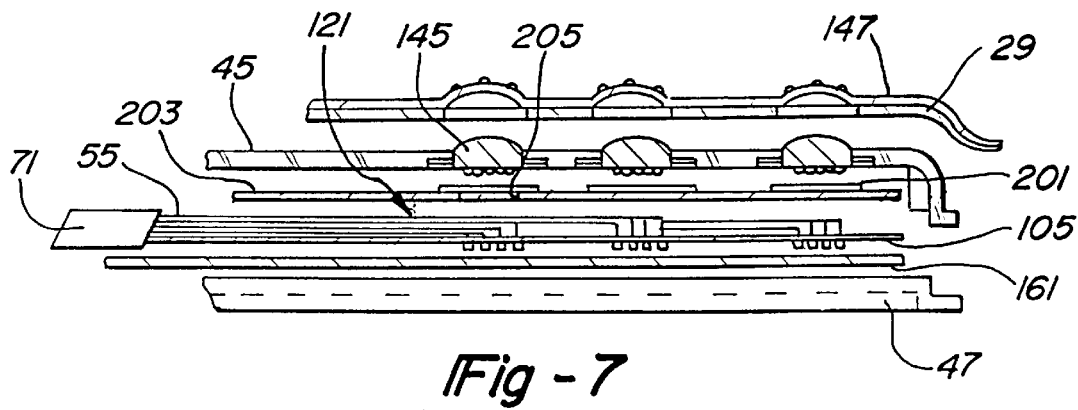
FIG. 7 is an exploded cross sectional view, taken along line 7—7 of FIG. 6, showing the second alternate embodiment integrated interior trim and electrical assembly of the present invention.

A second alternate embodiment of the integrated interior trim and electrical assembly of the present invention is illustrated in FIGS. 5 through 7. Hybrid junction box 25 and the interior trim panel are generally the same as with the preferred embodiment although the electronic components 167, 169 and 171 (see FIG. 4) may need to be added within junction box 25. However, tactile domes 143 (also see FIG. 4) of the preferred embodiment have been replaced by conductive elastomeric and resilient pads 201 adhered to insulating spacer and carrier 203. Accordingly, when actuator buttons 145 are depressed, pads 201 are compressed through openings 205 within carrier 203 for providing an electrical bridge or contactor between alternating switch contact patterns 121 on each offset corresponding flexible printed circuit board layer 55 and 161. Conductive elastomeric pads 201, as well as pads 65 and 207 (see FIG. 1), are preferably made from a 65 durometer, Shore A, semiconductive silicon rubber which has been peroxide catalyzed and post cured for four hours at 200° Centigrade. This elastomeric pad contains a conductive metallic (e.g., silver) or carbon material and can be purchased from S/G Industries, Inc. of Memphis, Tenn. FIG. 14 shows the general electrical and layer relationship of the hybrid junction box, switch module and electricity activated devices.

Figure 8:
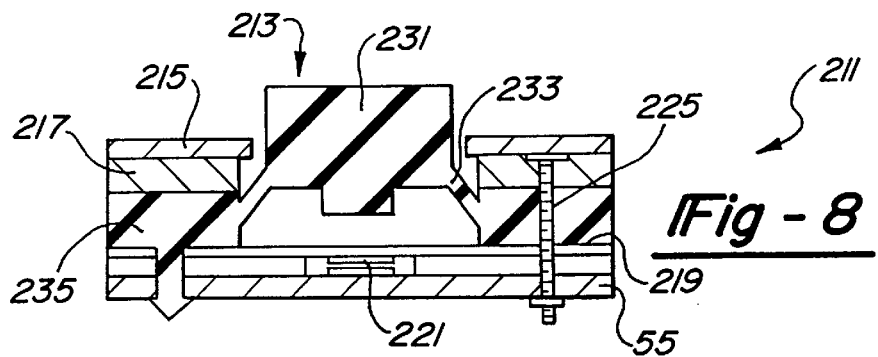
FIG. 8 is a cross sectional view showing a third alternate embodiment of the integrated interior trim and electrical assembly of the present invention.

Referring to FIG. 8, a third alternate embodiment of the integrated interior trim and electrical assembly of the present invention has a switch 211 including a nonconductive silicon rubber keypad 213, a graphic overlay 215, an aesthetically pleasing plastic bezel or switch base 217, a flexible insulating layer 219 carrying a printed conductive shorting pad 221 and flexible printed circuit board 55 containing an aperture for access to the traces. A mounting stud 225 or adhesive may be used to secure keypad 213 within the switch module. Keypad 213 is further defined by a key top 231, a flexible web 233 and an affixed key base 235.

Figure 9:
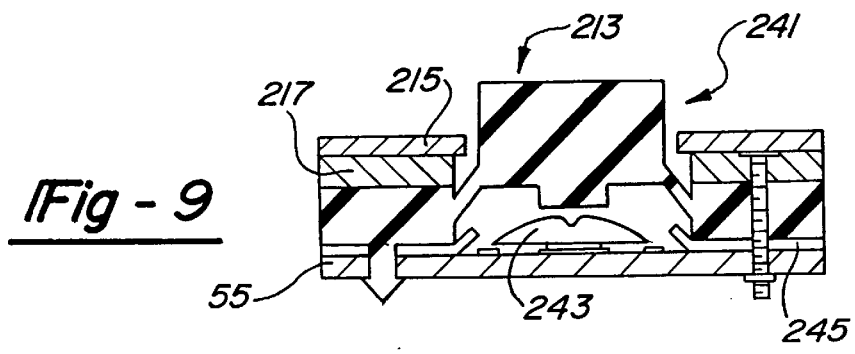
FIG. 9 is a cross section view, similar to that of FIG. 8, showing a fourth alternate embodiment of the integrated interior trim and electrical assembly of the present invention.

A fourth alternate embodiment of the present invention integrated interior trim and electrical assembly is shown in FIG. 9. This switch 241 is integrated into the hybrid junction box circuits as was disclosed with the preferred embodiment. In this alternate embodiment, a conductive stainless steel tactile dome or popple 243 and a dome holder 245 are substituted in place of shorting pad 221 (see FIG. 8).

Figure 10:
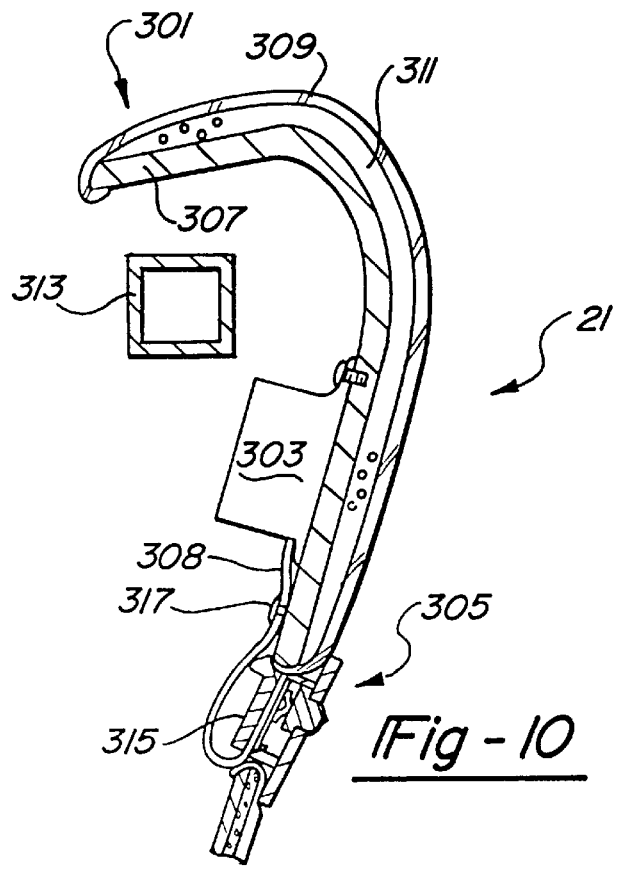
FIG. 10 is a cross sectional view showing a fifth alternate embodiment of the integrated interior trim and electrical assembly of the present invention.

As can be observed in FIG. 10, a fifth alternate embodiment of the integrated interior trim and electrical assembly 21 of the present invention includes an interior trim instrument panel 301, a hybrid junction box 303 and a remote switch assembly 305. Instrument panel 301 has an injection molded or reaction injection molded substrate 307 and an aesthetically pleasing vinyl covering material 309 with a reaction injection molded foam 311 injected therebetween. It is important to distinguish the instrument panel supporting and structural substrate 307 from a nonstructural injection molded instrument cluster assembly (not shown) which retains a variety of tightly packed instruments and lights. A metal reinforcing bar or brace 313 extends in a crosscar manner for supporting and fastening instrument panel 301 to the automotive vehicle body. Brace 313 may have many other traditional configurations depending upon the specific instrument panel and vehicle body constructions.

Junction box 303 is directly screwed upon the backside of substrate 307 and is constructed in accordance with the teachings of the preferred embodiment. A flexible printed circuit board layer 308 emanates from within junction box 303 and is incorporated into switch 305 as was disclosed with any of the preceding embodiments. The specific switch construction shown in FIG. 10, employs a bezel retaining switch housing 315 which is snap fit onto orifice edges of instrument panel substrate 307. Flexible printed circuit board layer 308 is directly fastened to the backside of substrate 307 by melting and expanding a head of a pin 317 projecting from a thermoplastic substrate 307 or can alternately be screwed onto a thermoset substrate 307.

Figure 11:
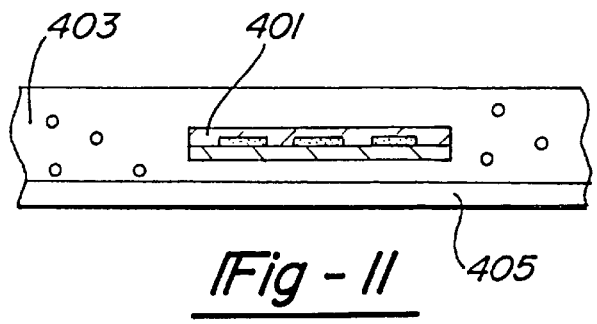
FIG. 11 is a cross sectional view showing a sixth alternate embodiment of the integrated interior trim and electrical assembly of the present invention.

FIG. 11 illustrates a sixth alternate embodiment of the integrated interior trim and electrical assembly of the present invention wherein a sheet-like circuit layer 401, preferably a flexible printed circuit board layer having traces with a generally polygonal cross section, is insert molded and encapsulated within the instrument panel or the door trim panel foam 403. This foam is preferably the glass-filled rigid and structural substrate foam but may alternately be the relatively softer foam disposed between the substrate and the covering material 405.

Figure 12:
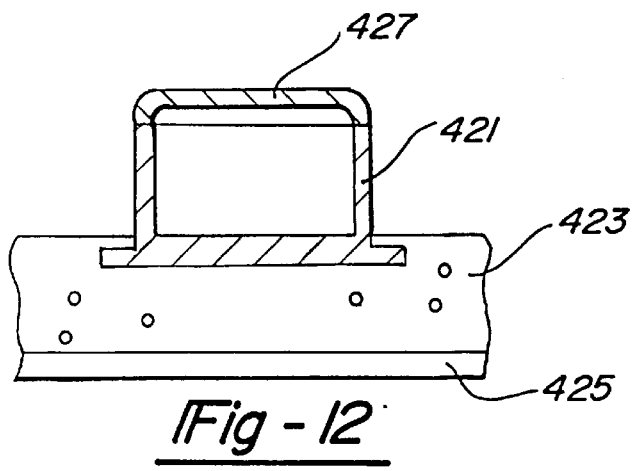
FIG. 12 is a cross sectional view showing a seventh alternate embodiment of the integrated interior trim and electrical assembly of the present invention.

A plastic junction box 421 is shown insert molded into the generally rigid substrate 423 of the instrument panel or door trim panel of the seventh alternate embodiment of FIG. 12. The substrate material is covered by an aesthetically pleasing covering material 425, such as polyvinyl chloride or a barrier layer and fabric combination. A variety of circuit layers, such as those disclosed with the preferred embodiment, are intended to be contained within a housing of junction box 421 and covered by a power distribution box cover 427.

While the various embodiments of this integrated interior trim and electrical assembly have been disclosed, it will be appreciated that various modifications may be made without departing from the present invention. For example, the present invention covers a junction box having only flexible printed circuit board layers therewithin. Furthermore, while a specific hybrid junction box having conductive deposited metal traces, a printed circuit board, a busboard and insulator assembly, and a flexible printed circuit has been disclosed, a hybrid junction box of the present invention may alternatively have any dissimilar paired combination of these electric current circuits therein. The junction box may also be oriented in any position and the internal layers may be stacked in a different order depending on the specific vehicle packaging and electrical requirements. Additionally, it is envisioned that a junction box and/or sheet-like conductive layer can be directly attached or molded to other interior trim panel substrates such as compression molded resinated fiber or foam headliners, shelf trim panels, trunk trim panels or under carpet insulators. It should also be appreciated that the sheet-like conductive layer may alternately take the form of any other generally flat (prior to flexing) member containing a conductive circuit. Various materials have been disclosed in an exemplary fashion, however, other materials may of course be employed. It is intended by the following claims to cover these and any other departures from the disclosed embodiments which fall within the true spirit of this invention.

The invention claimed is:

1. An integrated assembly for use in an automotive vehicle comprising:
   an interior trim panel having a substrate and an aesthetic covering material;
   a first occupant operable switch mounted upon said interior trim panel;
   a second occupant operable switch mounted upon said interior trim panel;
   a sheet-like electrically conductive layer having multiple circuit traces electrically connected to said switches, said sheet-like layer being secured to said substrate of said interior trim panel and externally extending from said switches;
   a junction box directly connected to said sheet-like electrically conductive layer; and
   a first electricity activated device receiving electricity through said sheet-like electrically conductive layer.

2. The integrated assembly of claim 1 wherein said sheet-like electrically conductive layer is flexible.

3. The integrated assembly of claim 2 wherein said switches each include:
   an actuator button;
   switch bridging means for selectively conducting electricity; and
   switch circuit contacts integrally created on said sheet-like electrically conductive layer with said traces running along the majority of said sheet-like electrically conductive layer, said sheet-like electrically conductive layer being disposed within and exiting said switch without any dissimilar circuit means connected therein;
   whereby depression of said actuator button causes said switch bridging means to directly touch and conduct electrical current between said switch circuit contacts thereby energizing said electricity activated device.

4. The integrated assembly of claim 1 further comprising a substantially rigid electrically conductive layer disposed within said junction box being electrically connected to said first sheet-like electrically conductive layer and distributing electrical current to a second electricity activated device and a third electricity activated device, a majority of said substantially rigid electrically conductive layer being substantially flat.

5. The integrated assembly of claim 4 wherein said substantially rigid electrically conductive layer is defined as a rigid printed circuit board retaining a microprocessor.

6. The integrated assembly of claim 4 wherein said substantially rigid electrically conductive layer is defined as an alternating and stacked assembly of multiple busbar and insulator sublayers.

7. The integrated assembly of claim 4 wherein said substantially rigid electrically conductive layer is defined as at least one conductive deposited trace affixed to an inside surface of a substantially nonconductive wall.

8. The integrated assembly of claim 4 wherein said first and second electricity activated devices are selected from the group consisting essentially but not exclusively of: a window lift motor, a door lock electromagnetic device, a light, and an electric mirror device.

9. The integrated assembly of claim 4 wherein portions of said sheet-like electrically conductive layer and said substantially rigid electrically conductive layer are housed within a substantially nonconductive casing of said junction box.

10. The integrated assembly of claim 9 wherein said interior trim panel is defined as a door panel and said junction box casing is affixed to said substrate.

11. The integrated assembly of claim 9 wherein said interior trim panel is defined as an instrument panel with said substantially rigid substrate being polymeric, said junction box casing is affixed to said substrate.

12. An integrated assembly for use in an automotive vehicle comprising:

an interior trim panel having a substantially rigid substrate and an aesthetic covering material; and a junction box being affixed including a casing within which are including a casing within which are disposed at least a pair of differing electrically conductive circuit layers being selected from the group consisting of: a rigid printed circuit board layer, a flexible printed circuit board layer, an insulator and busbar assembly layer, and a deposit conductive trace layer deposited onto said casing.

13. The integrated assembly of claim 12 further comprising:

current overload protection means and a relay being mounted to said junction box and electrically connected to at least one of said circuit layers therein; and a plurality of lights being electrically connected to at least the other of said circuit layers of said junction box.

14. The integrated assembly of claim 12 wherein said interior trim panel is defined as a door trim panel.

15. The integrated assembly of claim 12 wherein said interior trim panel is defined as an instrument panel with said substantially rigid substrate being polymeric.

16. The integrated assembly of claim 12 further comprising an occupant operable switch being electrically connected to one of said circuit board layers extending external from said junction box, said switch being affixed to said interior trim panel.

17. The integrated assembly of claim 16 wherein said switch includes:

an actuator button;

switch bridging means for selectively conducting electricity; and switch circuit contacts disposed on said one of said circuit board layers;

whereby depression of said actuator button causes said switch bridging means to conduct electrical current between said switch circuit contacts thereby energizing an electricity activated device.

18. An integrated assembly for use in an automotive vehicle comprising an automotive vehicle interior trim panel having a substrate and an aesthetically pleasing covering material, a flexible sheet-like electrically conductive layer being formed within and directly affixed to said interior trim panel.

19. The integrated assembly of claim 18 wherein a substantially rigid substrate is reaction injection molded around a cross section of said electrically conductive layer.

20. The integrated assembly of claim 18 wherein said interior trim panel is a door trim panel.

21. The integrated assembly of claim 18 wherein said interior trim panel is an instrument panel.

22. The integrated assembly of claim 18 further comprising switch bridging means for conducting electricity operably contacting against switch contacts on said electrically conductive layer.

23. An integrated assembly for use in an automotive vehicle comprising an automotive vehicle interior door trim panel having a substantially rigid substrate and an aesthetically pleasing covering material, a junction box being mounted directly to said substrate, said junction box including electrically conductive circuit means for distributing electricity from an input lead to at least two output leads, said leads being electrically connected to said junction box through separate electrical connectors.

24. An integrated assembly for use in an automotive vehicle comprising an automotive vehicle interior trim panel having a substantially rigid polymeric substrate and an aesthetically pleasing covering material, at least a portion of a junction box being molded into and directly affixed to said substrate.

25. The integrated assembly of claim 24 wherein said interior trim panel is defined as a door panel.

26. The integrated assembly of claim 24 wherein said interior trim panel is defined as an instrument panel.

27. An integrated assembly for use in an automotive vehicle comprising:

an interior trim panel having a substrate and an aesthetic covering material;

an occupant operable switch mounted upon said interior trim panel;

a circuit layer electrically connected to said switch, said circuit layer being secured to said substrate of said interior trim panel and externally extending from said switch; and a junction box being disposed behind said substrate, said junction box including a casing within which is disposed at least a portion of said circuit layer.

28. The integrated assembly of claim 27 wherein said circuit layer is flexible and sheet-like.

29. An automotive vehicle junction box comprising:

a junction box casing defining an internal cavity;

circuit layer means for conducting and distributing electricity between externally accessible electrical connectors; and a conductive elastomeric pad disposed within said junction box casing and electrically connecting at least two of said circuit layer means.

30. The junction box of claim 29 further comprising a generally U-shaped compression clip compressing said conductive elastomeric pad against at least one of said circuit layer means.

31. The junction box of claim 30 wherein said compression clip includes a middle section containing multiple ridges and a pair of upturned legs having barbed snap fits at distal ends of said legs.

* * * * *